(12) United States Patent
Van De Ruit et al.

(10) Patent No.: US 10,459,354 B2
(45) Date of Patent: Oct. 29, 2019

(54) LITHOGRAPHIC APPARATUS AND LITHOGRAPHIC PROJECTION METHOD

(71) Applicant: ASML Netherlands B.V., Veldhoven (NL)

(72) Inventors: Kevin Van De Ruit, Eindhoven (NL); Bart Dinand Paarhuis, Waalre (NL); Jean-Philippe Xavier Van Damme, Wezembeek-Oppem (BE); Johannes Onvlee, 's-Hertogenbosch (NL); Cornelis Melchior Brouwer, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/565,082

(22) PCT Filed: Mar. 24, 2016

(86) PCT No.: PCT/EP2016/056498
§ 371 (c)(1),
(2) Date: Oct. 6, 2017

(87) PCT Pub. No.: WO2016/169727
PCT Pub. Date: Oct. 27, 2016

(65) Prior Publication Data
US 2018/0095369 A1  Apr. 5, 2018

(30) Foreign Application Priority Data

Apr. 23, 2015 (EP) .................................... 15164923

(51) Int. Cl.
*G01B 11/24* (2006.01)
*G03F 7/20* (2006.01)
*G03F 1/62* (2012.01)

(52) U.S. Cl.
CPC ............ *G03F 7/70983* (2013.01); *G03F 1/62* (2013.01); *G03F 7/2002* (2013.01);
(Continued)

(58) Field of Classification Search
CPC .......... G03F 7/20; G03F 7/70983; G03F 1/62; G03F 7/2002; G03F 7/70258; G03F 7/7085; G01B 2210/56; G03B 27/42
See application file for complete search history.

(56) References Cited

U.S. PATENT DOCUMENTS 6,834,549 B2  12/2004  Shu et al.
6,867,845 B2  3/2005  Kanda
(Continued)

OTHER PUBLICATIONS

International Search Report and Written Opinion dated Jul. 1, 2016 in corresponding International Patent Application No. PCT/EP2016/056498.
(Continued)

*Primary Examiner* — Jamil Ahmed
(74) *Attorney, Agent, or Firm* — Pillsbury Winthrop Shaw Pittman LLP

(57) ABSTRACT

A lithographic apparatus including a support to support a patterning device, a substrate table to hold a substrate, and a projection system to project a radiation beam patterned by the patterning device onto a target portion of the substrate. A transparent layer is provided to protect the pattering device. The apparatus further includes a transparent layer deformation-determining device to determine a deformation profile of the transparent layer, the deformation profile of the transparent layer expressing a deformation of the transparent layer during a scanning movement of the lithographic apparatus, and a compensator device which is configured to control the projection system, the substrate table and/or the support in response to the deformation profile of the trans-
(Continued)

parent layer to compensate for the deformation of the transparent layer during the scanning movement of the apparatus.

20 Claims, 6 Drawing Sheets

(52) U.S. Cl.
CPC ........ *G03F 7/7085* (2013.01); *G03F 7/70258* (2013.01); *G01B 2210/56* (2013.01)

(56) References Cited

U.S. PATENT DOCUMENTS

| | | | |
|---|---|---|---|
| 6,870,599 | B2 | 3/2005 | Kurosawa |
| 7,379,154 | B2 | 5/2008 | Jasper et al. |
| 2002/0126269 | A1 | 9/2002 | Sato |
| 2003/0197848 | A1 | 10/2003 | Shiraishi |
| 2004/0194556 | A1 | 10/2004 | Shu et al. |
| 2005/0140949 | A1* | 6/2005 | Jasper ..................... G03F 1/62 355/53 |

OTHER PUBLICATIONS

International Preliminary Report on Patentability dated Oct. 24, 2017 in corresponding International Patent Application No. PCT/EP2016/056498.

\* cited by examiner

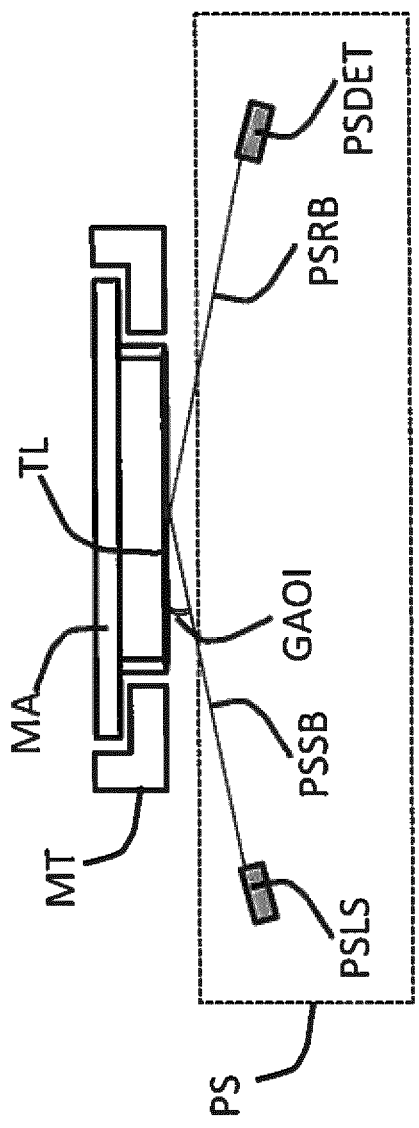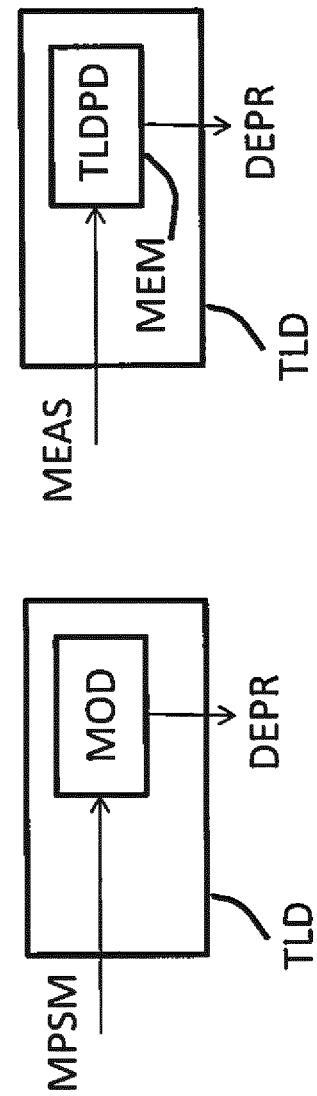
Fig.4
Fig.5
Fig.6

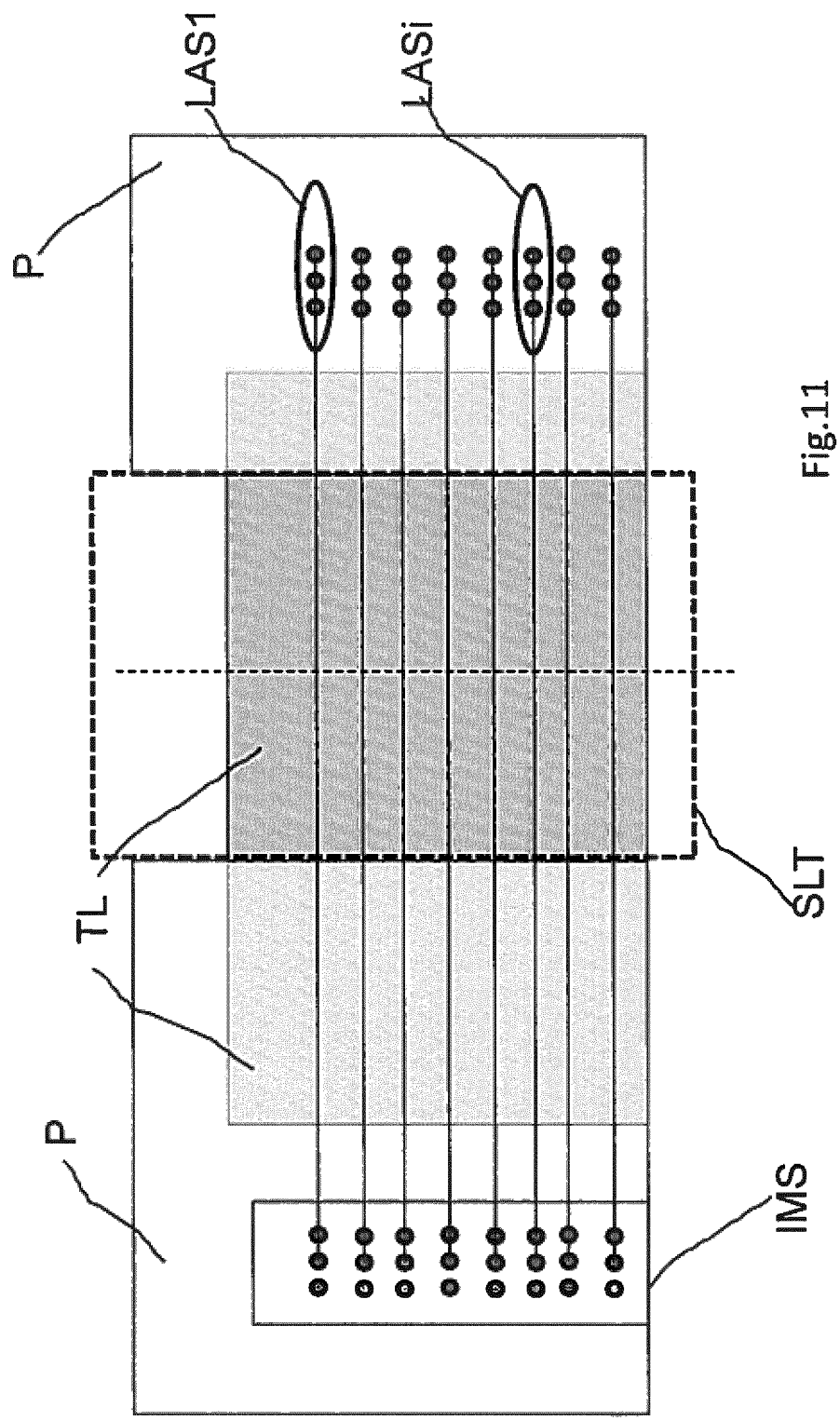

LITHOGRAPHIC APPARATUS AND LITHOGRAPHIC PROJECTION METHOD

BACKGROUND

CROSS-REFERENCE TO RELATED APPLICATIONS

This application is the U.S. national phase entry of PCT patent application no. PCT/EP2016/056498, which was filed on Mar. 24, 2016, which claims the benefit of priority of European patent application no. 15164923.3, which was filed on Apr. 23, 2015, and which is incorporated herein in its entirety by reference.

FIELD OF THE INVENTION

The present invention relates to a lithographic apparatus and to a method of operating a lithographic apparatus.

DESCRIPTION OF THE RELATED ART

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, the patterning device may be protected by a layer that is transparent to the radiation used for imaging the pattern onto the target portion. The layer may be implemented as a membrane kept at a short distance from the patterning device. Such membrane is also referred to as "pellicle". The transparent layer allows the beam of radiation to be transmitted there through while providing some protection of the patterning device against damage, contamination, etc. In an embodiment, a pellicle is a thin, transparent film that is attached by a frame to the patterning device at side of the patterning device facing the projection system. The pellicle and its frame keep the space between the pellicle and the patterning device free from dust and other foreign particles. In this way, any particles near the patterning device are kept away from the object plane and thus will be imaged out of focus in order to reduce or prevent imaging defects. The transparent layer may be provided at, and extend along a side of, the patterning device facing the projection system. Published patent application US20050140949, incorporated herein by reference, discloses the detection of a static pellicle deformation and the compensation thereof by means of a driving of the projection system, the substrate table and/or the support.

SUMMARY

Some of the components in the lithographic apparatus may perform movements during operation of the lithographic apparatus. For example, the substrate table that holds the substrate, and the support that supports the patterning device, may perform a scanning movement. Thereby, the support may be moved to follow the movements of the substrate table so as to project respective parts of the pattern from the patterning device onto the substrate. Due to the movements of the support, the transparent layer may be subjected to forces that may cause the pellicle to deform, such as acceleration/deceleration forces, air flows passing the transparent layer, etc. As a result of the deformation of the transparent layer, a projection of the pattern from the patterning device onto the substrate may be affected, causing an inaccuracy which may translate into an overlay error. More specifically, consider a location at the transparent layer where, at a certain moment, the beam of the patterned radiation is incident on the pellicle. A local tilt of the pellicle at that location may cause the patterned beam of radiation exiting the transparent layer to be translated relative to the incident beam and in a direction perpendicular to the incident beam. If different locations at the transparent layer assume different magnitudes of tilt when the patterned beam of radiation falls on the relevant one of the different locations, the patterned beam of radiation will be incident on the target portion of the substrate with an undesirable inaccuracy in position.

It is desirable to provide an accurate projection of the pattern onto the substrate.

According to an embodiment of the invention, there is provided a lithographic apparatus as specified in claim 1.

In another embodiment of the invention, there is provided a method of operating a lithographic apparatus as specified in claim 14.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 depicts a sensor according to an embodiment of the invention;

FIG. 5 depicts a highly schematic, block schematic view of a transparent layer deformation determining device according to an embodiment of the invention;

FIG. 6 depicts a highly schematic, block schematic view of a transparent layer deformation determining device according to another embodiment of the invention;

FIGS. 9, 10 and 11 are diagrams illustrating a manner of determining the local shape of the transparent layer.

DETAILED DESCRIPTION

Figure 1:
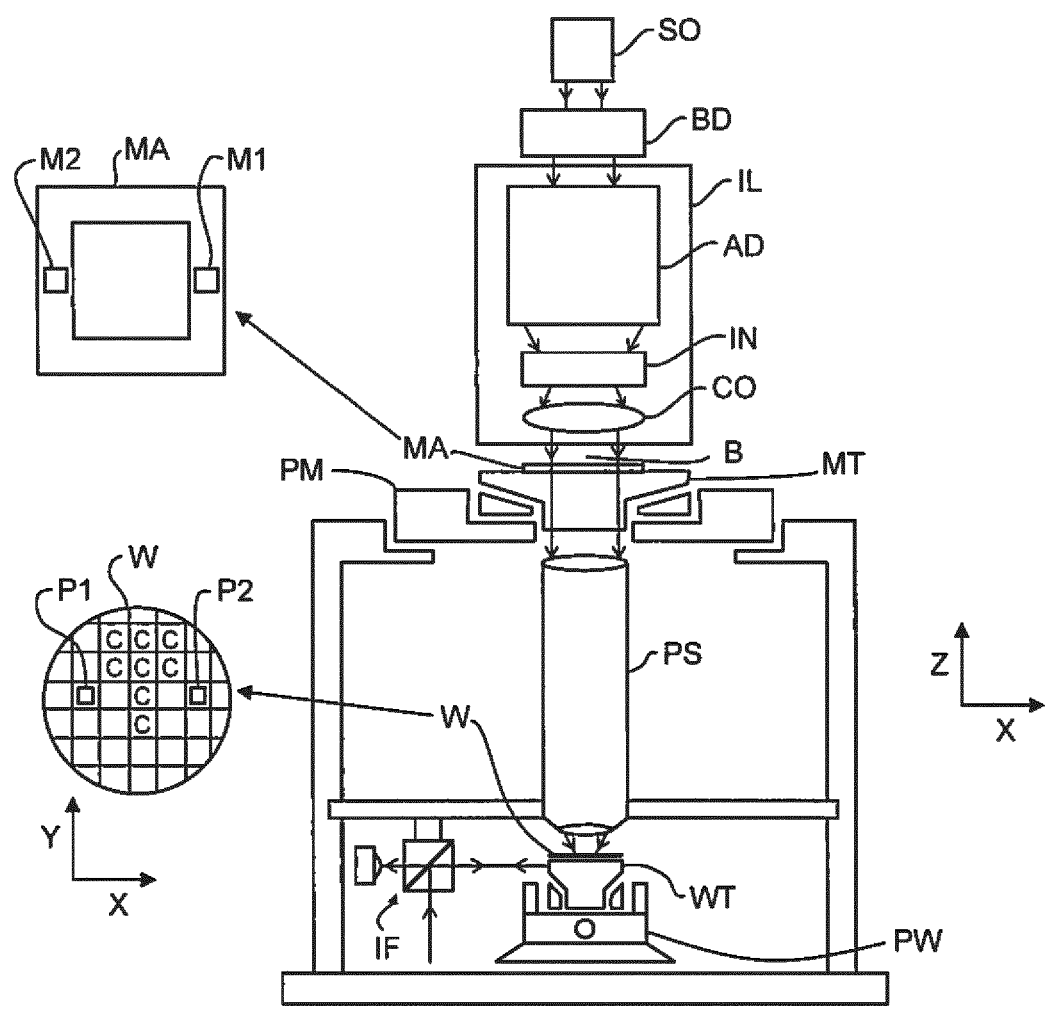
FIG. 1 depicts a lithographic apparatus in which an embodiment of the invention may be practiced.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system or a reflective optics system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general expression "patterning device".

The expression "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small minors, each of which can be individually tilted so as to reflect an incoming radiation beam in different directions. The tilted minors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted by way of example, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:
1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
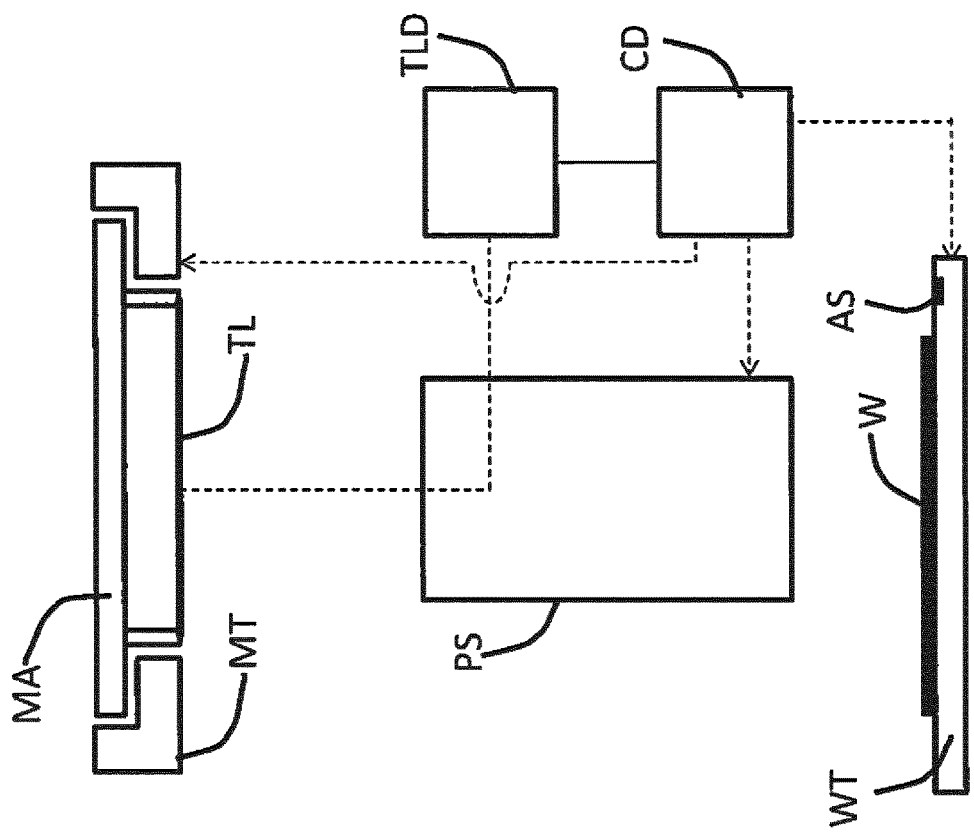
FIG. 2 depicts a schematic view of a part of a lithographic apparatus according to an embodiment of the invention.

FIG. 2 depicts a support MT that holds a patterning device MA. The support is provided with a transparent layer TL to protect the pattering device or the transparent layer is coupled to the patterning device MA in another manner. The transparent layer TL may for example be a pellicle. A transparent layer deformation determining device TLD, also referred to as "profiling system" throughout this text, is configured for determining a deformation profile of the transparent layer, the deformation profile of the transparent layer being indicative of a (dynamically changing) deformation of the transparent layer during a scanning movement of the lithographic apparatus. In an embodiment of a lithographic apparatus according to the invention, a compensator device CD, also referred to as "control system" throughout this text, is configured to control the lithographic apparatus so as to at least partly compensate for the deformation of the transparent layer during the scanning movement of the lithographic apparatus. Thereto, the compensator device CD (or: control system) drives, under control of the deformation profile of the transparent layer, at least one of: the projection system PS, the substrate table WT that holds substrate W, and the support MT that holds the patterning device MA. The transparent layer deformation determining device may obtain information about a deformation profile of the transparent layer as occurs during a movement of the lithographic apparatus in operational use of the lithographic apparatus. The transparent layer deformation determining device may obtain information about a deformation profile of the transparent layer, as occurs during a movement of the lithographic apparatus in operational use, from a measurement of the deformation of the transparent layer, or from a mathematical model, or from a measurement of an error resulting from the deformation, or from any combination thereof, as will be explained in more detail below. The substrate table WT may include one or more sensors AS that are used to position the substrate W correctly relative to the projection system PS. Typically, such sensors AS typically include a Transmission Image Sensor (TIS). A TIS is a sensor that is used to measure the position at substrate level of a projected aerial image of a mark pattern at the patterning device MA. Typically, the projected image at substrate level is a line pattern with a line width similar to projection beam wavelength. The TIS measures these mask patterns by using a transmission pattern with a radiation sensor underneath. The sensor data is used to measure the position of the patterning device MA with respect to the position of the substrate table WT in six degrees of freedom. The use of the sensor AS within the context of the invention will be briefly addressed with reference to FIG. 6.

Figure 3A:
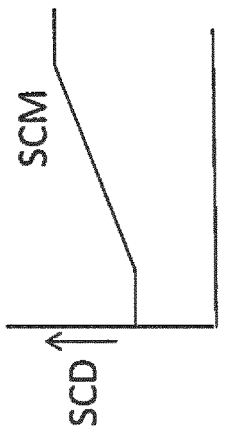
FIGS. 3A and 3B depict a graphical representation of a scanning movement and a deformation profile according to an embodiment of the invention.
Figure 3B:
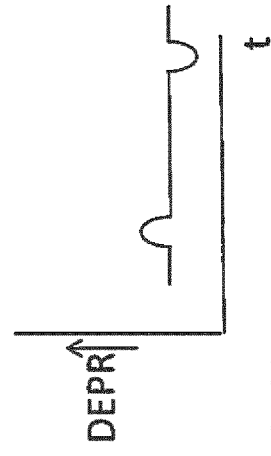

An example of a deformation profile will be described with reference to FIGS. 3A and 3B. FIG. 3A depicts a highly schematic example of a scanning movement SCM of the lithographic apparatus over time t. A position SCD of e.g. the substrate table WT or the support MT, relative to some reference, is depicted along the vertical axis, and time "t" is depicted along the horizontal axis. During a part of the scanning movement, the substrate table and/or the support move, e.g., at a constant velocity. A deformation profile DEPR of the transparent layer as occurring during the scanning movement of the support MT is schematically depicted in FIG. 3B and set out along the vertical axis, versus time "t" along the horizontal axis. The expression "deformation profile" is to be understood as a deformation of the transparent layer over time during a movement (such as a scanning movement) of the lithographic apparatus. The deformation profile may be expressed as a function of e.g. time, position or both. The deformation profile may be represented by a single scalar, such as a degree of concave-ness or convex-ness. Alternatively, the deformation profile may be expressed in terms of a one-dimensional array or a two-dimensional array of deformation at different locations of the surface of the transparent layer.

For example, assume that the transparent layer has a substantially planar shape when not subjected to forces. The influence of gravity is ignored here for the sake of argument. Consider a (imaginary) reference plane that is fixed to, and parallel to, the transparent layer. Let a position within the (imaginary) reference plane be specified by two coordinates X and Y. Then, the deformation of the transparent layer may be represented by a set of values (X, Y, Z), wherein the magnitude of Z is indicative of a distance between the transparent layer and the reference plane at the location (X,Y) in the reference plane. The parameter Z is also referred to as: the "deflection". The set of values (X, Y, Z) may be represented in a one-dimensional array. The magnitude of one of X and Y is then kept fixed. The specific magnitude of the other one of X and Y is associated with a specific element of the one-dimensional array, and the specific element has the magnitude Z. The set of values (X, Y, Z) may be represented in a two-dimensional array wherein the specific magnitude of X is associated with a specific column of the two-dimensional array and wherein the specific magnitude of Y is associated with a specific row of the two-dimensional array. During a movement of the lithographic apparatus, the magnitude of Z at a particular location (X, Y) will, generally, vary with time. Accordingly, the set of values (X, Y, Z) may change with time "t". That is, the deformation may be represented by the set of values (X, Y, Z, t), thus forming a 4-tuple that includes the time-dependence as a fourth element "t", besides the coordinates X, Y and Z.

As discussed further below with reference to the example of FIG. 9, the beam of radiation that has been patterned by the patterning device MA, arrives at the projection system through a slit in a plate P. The center of the slit is at $Y=Y_0$. Then, it is only the deflection Z at the slit at around $Y_0$ that has an impact on the imaging at any time "t". As a result, the relevant part of the deformation of the transparent layer over time may be represented by the set of values (X, $Y_0$, Z, t).

The set of values (X, Y, Z) is a discrete set, as are the set (X, Y, Z, t) and the set (X, Y0, Z, t). The local deflection $\partial z/\partial y$ of the transparent layer in the y-direction, and the local deflection $\partial z/\partial x$ in the x-direction, both over the slit, can be determined or estimated from the difference in the z-values at the associated neighboring locations in the y-direction and in the x-direction, respectively.

Different deformation profiles may be provided for different movements of the lithographic apparatus. Different movements may characterized by, e.g., different scan directions (up; down) or different scan profiles (different constant scan speeds or different accelerations). Typically, the deformation of the transparent layer depends on the scan direction, and is different for different scan speeds.

As described above, a deformation of the transparent layer may affect the path of the patterned beam of radiation, and hence the quality of the imaging of the pattern on the substrate covered with a photo-sensitive material, also referred to as "resist". If one knows, to a good approximation, the deformation of the transparent layer in operational use of the lithographic apparatus, one can determine the effect on the path of the patterned beam of radiation exiting the transparent layer and the effect on the eventual imaging of the pattern onto the substrate.

At the substrate, an effect of the deformation of the transparent layer is a displacement of the patterned beam of radiation from a desired position on the substrate. In order to at least partly compensate for that undesired displacement, the inventors propose to control the position and/or orientation of at least one of: one or more elements of the projection system, the substrate table and the support of the patterning device, under control of the deformation.

Thus, by determining the effect of a deformation of the transparent layer on the path of the patterned beam of radiation and driving at least one of the projection system, the substrate table and the support, thereby altering a property of the projection system (e.g. a focus), and/or altering a position of the substrate table and/or altering a position of the support and thus the patterning device, the effect of the deformation of the transparent layer (as is occurring during the scanning movement of the lithographic apparatus) onto the projection of the pattern onto the substrate may at least partly be compensated. The determining may be accomplished in real-time or via a mathematical model determined in advance.

FIG. 4 depicts a schematic view of a support MT that is provided with a patterning device MA and a transparent layer TL that protects the patterning device MA. A sensor PS senses a position of the transparent layer at a certain location on the transparent layer or another quantity indicative of the position of the transparent layer at the certain location. Any suitable sensor PS may be applied. Accordingly, in an embodiment, the transparent layer deformation determining device comprises a sensor PS configured to measure a profile of a position of the transparent layer during the scanning movement of the lithographic apparatus. The position of the transparent layer may be understood as a position of the transparent layer TL relative to the support MT. Thus, as the support MT moves, the sensor PS may sense a position of the transparent layer relative to the support. The position measurement of the transparent layer may enable to detect deformation of the transparent layer during a scanning movement of the lithographic apparatus. The deformation may occur as a result of one or more causes. For example, a deformation may be caused by gas flows (e.g., of air or nitrogen gas in the lithographic apparatus) in the vicinity of the transparent layer. The gas flows may be induced by relative movements of components within a gas environment. For example, the gas flows may be induced by the movement of the support and/or by a movement of the support in respect of other parts of the lithographic apparatus, e.g. a movement of the support relative to the projection system or a movement of the support relative to any other part of the lithographic apparatus. Other gas flows may be present and actively supplied in order to thermally condition, e.g., cool, certain components in the lithographic apparatus, e.g., the patterning device. Also, the deformation of the transparent layer may be caused by the movement of support itself, e.g., by an deformation of the transparent layer as a result of the inertia of the transparent layer and an acceleration of the support, during which the edges of the transparent layer tend to follow the acceleration as the edges of the transparent layer are connected (directly or indirectly) to the support, while a center of the transparent layer may deform during such acceleration due to latency, elasticity, etc. The position of the transparent layer may be measured as an in-plane position, i.e., in the plane of the transparent layer, an out-of-plane position, i.e. a position perpendicular to the plane of the transparent layer when at rest, etc.

In an embodiment, as depicted in FIG. 4, the sensor PS comprises a sensor laser source PSLS configured to radiate a scanning beam PSSB onto the transparent layer TL at a grazing angle of incidence GAOI, and a detector DET to detect a reflected beam PSRB as reflected from the transparent layer. Due to the grazing angle of incidence, the sensor laser source and the detector may be positioned outside and optical propagation path of the patterned beam. Moreover, at a grazing angle of incidence, most of the light in the scanning beam will be reflected to the detector DET. Furthermore, an interaction of the scanning beam with the patterned beam that is projected onto the substrate, may be prevented thereby. The scanning beam may scan a surface of the transparent layer so as to measure a position of the transparent layer at a variety of locations on the surface of the transparent layer, thereby allowing gaining information about an occurrence of resonances, travelling waves, etc. in the transparent layer. Still further, e.g. in the case of performing a scanning movement whereby parts of the patterning device are repetitively projected onto the substrate via a slit (not shown), the sensor PS may direct the scanning laser beam at the parts of the transparent layer through which the patterned beam travels at that moment, thus allowing to detect a position of the transparent layer exactly at the locations where the patterned beam is propagating through the transparent layer, thus allowing an accurate position measurement of the relevant portion of the transparent layer. Furthermore, a position measurement by the laser may be fast, thus allowing following movements of the transparent layer so as to be able to take account thereof as will further be described below.

Other embodiments of the sensor PS may be envisaged. For example, the sensor PS may comprise an air pressure sensor or an array of air pressure sensors that are arranged in, and measure a pressure in, a space between the patterning device and the transparent layer. A deformation of transparent layer may result in a pressure change in the space between the transparent layer and the patterning device. In case of an array of air pressure sensors, the array for example extending along the transparent layer, a spatial profile of the deformation may be recorded.

FIG. 5 depicts a highly schematic view of a transparent layer deformation determining device TLD (also referred to as "profiling system"). In this embodiment, as an alternative to, or in addition to, the sensor PS as described above, the transparent layer deformation determining device comprises a mathematical model MOD of the transparent layer TL and is configured to calculate a deformation profile DEPR of the transparent layer from a movement profile of the scanning movement MPSM of the lithographic apparatus and from the mathematical model. The mathematical model may be a finite element model (FEM) in order to enable to take account of properties of the transparent layer, such as stiffness, resonance behavior, elasticity, etc. Any suitable mathematical model may be applied, such as a numerical model.

The mathematical model MOD may have been determined in advance outside the lithographic machine, or may be determined in advance using the profiling system of the lithographic apparatus, e.g., operated in a calibration mode before operational use of the lithographic apparatus or operated during a preceding imaging operation conducted on a preceding substrate of a lot of substrates to be imaged sequentially.

Additionally, mathematical model may be configured to take into account the effect of a gas flow AF at the transparent layer to calculate or estimate the deformation profile of the transparent layer under the combined influence of the acceleration of the support and the gas flows. An effect of the gas flow on the transparent layer may be large. That is, a spatial distribution of the pressure on the transparent layer as a result of the gas flow may provide a relevant or dominant contribution to the overall deformation of the transparent layer. Modelling of the effect of the gas flow on the deformation may provide a substantial increase in accuracy of the modelling of the deformation of the transparent layer.

FIG. 6 depicts a highly schematic view of a transparent layer deformation determining device TLD in accordance with an embodiment of the invention. In this embodiment, the transparent layer deformation determining device TLD comprises a memory MEM in which transparent layer deformation profile data TLDPD is stored, the transparent layer deformation profile data expressing a profile of transparent layer deformation during a scanning movement of the lithographic apparatus and having been measured in advance. Thus, a measurement may be performed, whereby the lithographic apparatus performs a scanning movement or other movement that is similar to a movement as to be made in operation, i.e., during imaging. The deformation of the transparent layer or an effect of the deformation of the transparent layer may be measured and measurement results MEAS provided to the transparent layer deformation determining device. For example, a deformation of the transparent layer may be measured using the sensor PS (such as the grazing incidence laser scanner) as described above, during a movement of the lithographic apparatus. Alternatively, an effect of the deformation may be measured, examples of which will be described below. Correspondingly, a measurement is performed during a test movement, and a profile of a deformation of the transparent layer is derived therefrom. A plurality of such (e.g. different or partly different) movements may be performed and corresponding deformation profiles may be derived therefrom and stored. In operational use of the lithographic apparatus, when a particular movement is being performed, a stored deformation profile as obtained from a movement that resembles the movement to be made or being made, may be applied to provide a close approximation of the deformation profile that may actually occur during such movement.

The measurement may be performed in many ways. For example, use may be made of an alignment sensor of the lithographic apparatus (such as the alignment sensor AS as depicted in FIG. 2), which is for example provided on the substrate table WT and which is used to measure an alignment of the lithographic apparatus in that a beam from the irradiation source is directed via the patterning device and the projection system onto the alignment sensor in the substrate table. An example of such an alignment sensor is a transmission image sensor (TIS sensor). Correspondingly, in an embodiment, the lithographic apparatus further comprises an alignment sensor AS and the transparent layer deformation determining device is configured to derive the transparent layer deformation profile data from a measurement by the alignment sensor of an alignment profile during a scanning movement of the lithographic apparatus, and to store the derived transparent layer deformation profile data in the memory. As the radiation beam that reaches the alignment sensor passes through the transparent layer, the image achieved on the alignment sensor provides an indication of a presence of deformation of the transparent layer. The measurement using the alignment sensor may be performed stationary or during a movement, e.g. a scanning movement of the lithographic apparatus which movement may resemble a movement during operation of the lithographic apparatus to a large extent (the only difference may be that in normal operation the beam is directed onto a target area of the substrate instead on onto the alignment sensor), causing disturbances onto the transparent layer and resulting deformation thereof to be closely related to disturbances and deformation as may be caused during normal operation. The profile as measured by the alignment sensor may be used to generate the deformation profile which may then be stored in the memory to be used to compensate a future movement that resembles the movement profile of the alignment measurement. A plurality of profiles, as determined for a plurality of movement profiles of the lithographic apparatus, may be determined and stored in the memory. During operation of the lithographic apparatus, a stored pattern relating to a movement profile that has a largest correspondence to a movement profile as will be performed, may be chosen.

Figure 7:
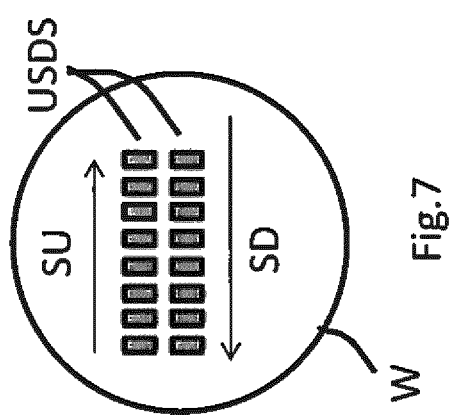
FIG. 7 depicts a sequence of patterns on a substrate as projected during a scanning movement of the lithographic apparatus.

Another possibility for measurement will be explained with reference to FIG. 7. FIG. 7 depicts a substrate W that is provided with a sequence of successive up-scan and down-scan projected patterns. The terms "up-scan" and "down-scan" indicate opposite (anti-parallel) scanning directions, also referred to as "scan-up" (SU) and "scan-down" (SD), respectively. More generally, patterns may be provided by irradiating e.g. a sequence of test patterns on a substrate. Information about a deformation of the patterning device may be derived from the projected patterns. Accordingly, in an embodiment, the transparent layer deformation profile data as stored in the memory has been derived from a projection by the lithographic apparatus of a sequence of patterns onto a substrate during a scanning movement of the lithographic apparatus, and a measurement of an error in the projected patterns as obtained during the scanning movement of the lithographic apparatus. Information may be derived from the projected patterns themselves (e.g. a deformation in the pattern) as well as from a comparison of the patterns with each other. For example, referring to FIG. 7, when the scanning movement of the lithographic apparatus comprises an up-scan movement and a down-scan movement, the transparent layer deformation profile data have been derived from a comparison of the projected patterns during the up-scan movement and during the down-scan movement (patterns USDS in FIG. 7). During up-scan and down-scan, disturbances onto the transparent layer (e.g. acceleration profiles, effect of gas flows) may be opposite to each other, enabling to derive a deformation related effects from a comparison of up-scan and down-scan.

Figure 8:
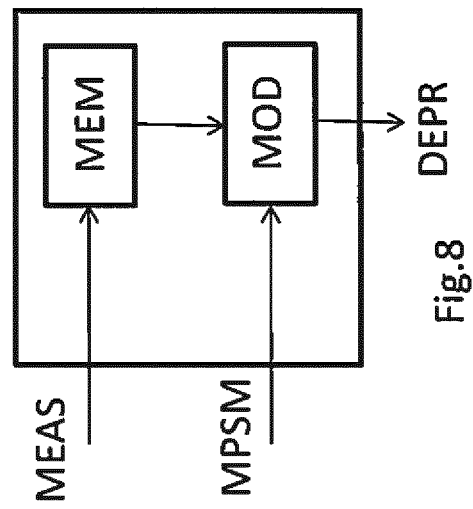
FIG. 8 depicts a highly schematic, block schematic view of a transparent layer deformation determining device according to yet another embodiment of the invention.

FIG. 8 depicts a highly schematic view of a transparent layer deformation determining device TLD in accordance with another embodiment of the invention. The transparent layer deformation determining device comprises both a memory MEM and a model MOD, as have both been described above. The memory is provided with measurement data MEAS as described previously. The model MOD is provided with a movement profile of the scanning movement MPSM as described previously. Making use of both the mathematical model as described above as well as the deformation profile data as stored in the memory, a further improvement in accuracy of estimation may be obtained in that the transparent layer deformation determining device is configured to calibrate the mathematical model from the transparent layer deformation profile data as stored in the memory.

In order to compensate for slow variations in the physical properties of the transparent layer, e.g., elasticity, refractive index, such as caused by aging or temperature effects, e.g. a warming up of the transparent layer as a result of heat generated during operation of the lithographic apparatus, the compensator device CD is configured to control at least one of the projection system, the substrate table and the support during the scanning of a following substrate from the deformation profile of the transparent layer as measured during a scanning of a current substrate. Thus, deviations as detected and as may result from a deformation of the transparent layer may be processed and taken into account in a later scan. Also, aging of the transparent layer and corresponding change in elastic properties thereof as a result of a repetitive irradiation, may be taken into account thereby. The above may be relevant if the measurement data is determined only once for each patterning device, and re-use the data every time that that particular patterning device is loaded onto the system. Alternatively, the measurement can be repeated each time the reticle is loaded onto the system, possibly at the cost of the system's productivity, depending on how fast the measurement can be executed.

The compensator device may control any suitable parameter in the lithographic apparatus. In particular, in order to effectively compensate at least part of the effects on the patterned beam of radiation as a result of the deformation of the transparent layer, the compensator device may be configured to drive the projection system to correct a position of a projection element of the projection system, drive the support to correct a position of the support and/or drive the substrate table to correct a position of the substrate table.

Accordingly, an aspect of the invention resides in sensing or modeling the spatial profile of deformation of the transparent layer. The spatial deformation profile may be determined by sensing in operational use of the lithographic apparatus, or via inspection of portions on a substrate that has been imaged in a lithographic apparatus according the invention, via a mathematical model determined in advance, or any combination thereof. Another aspect resides in correcting the optical path of the patterned beam of radiation under control of the sensed and/or modeled deformation of the transparent layer, e.g., via control of the projection system, of the support of the patterning device, of the substrate table, or any combination thereof.

As explained above, if the support is scanning the patterning device with the transparent layer (pellicle) being present, the pellicle deforms. Pressure pulses, and gas flows result in local pressure differences acting on the pellicle. The deformation can be different for the scan-up and scan-down directions and can be different for different scan speeds. The deformation can depend on the thickness of the pellicle, on the distance between the reticle and the pellicle, on the material of the pellicle, etc. The deformation can be different for multiple instances of the same pellicle type. The deformation can be different for each individual scan. Due to the difference in refractive index between the pellicle's material and the gas surrounding the pellicle, and due to the local shape of the frame holding the pellicle, the patterned beam of radiation passing through the pellicle will be deflected (parallel plane effect), which will eventually result in local overlay errors at the substrate.

Assume that the shape (or profile) of the transparent layer TL can be described as a mathematical relationship $z=z(x, y, t)$, wherein x and y are the Cartesian coordinates in the plane of the patterning device. The y-axis is parallel to the scanning direction, "t" is the time and "z" is the distance between a virtual plane spanned by the x-axis and the y-axis and the transparent layer at the location x, y. From this profile $z=z(x, y, t)$ the shifting of a patterned beam of radiation can be calculated, the shifting being in the x,y plane, resulting in an error function $T=T(x,y,t)$ at the substrate level. As the patterning device is being scanned, only a specific portion thereof is relevant at a specific time, namely, the portion that patterns the beam of radiation passing through a slit in a plate between the transparent layer TL and the projection system PS.

Figure 9:
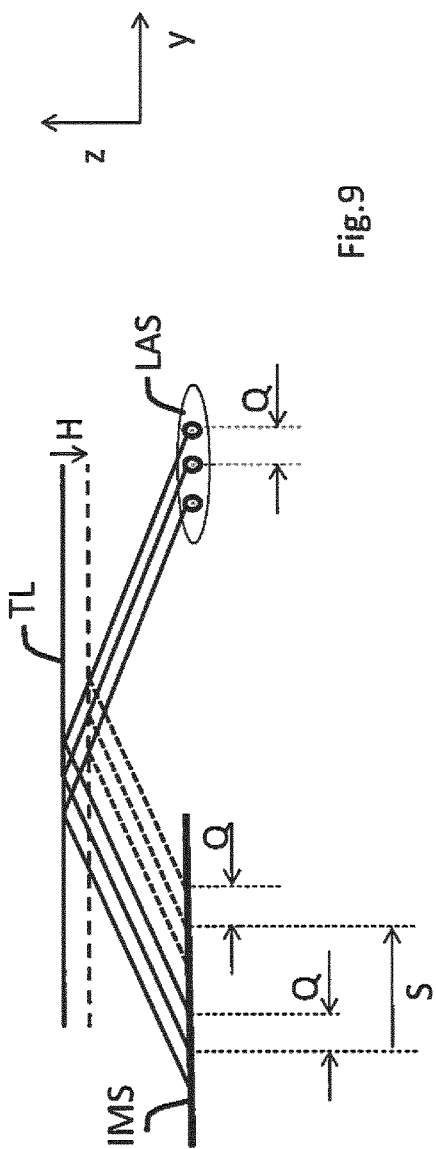

The diagram of FIG. 9 illustrates a part of a further embodiment of a lithographic apparatus in the invention, here an atmospheric lithographic apparatus such as an immersion lithographic apparatus. One or more sets, each with multiple lasers LAS, e.g., three lasers, are accommodated at a surface S of a plate P between the transparent layer TL and the projection system PS (not shown here). The plate P has a slit through which the patterned beam of radiation arrives at the projection system PS. Alternatively, two or more individual plates (not shown) can be arranged to form the slit. The surface may be arranged substantially parallel to the patterning device MA. Each set of lasers is pointed at an area of the transparent layer TL traversed by the patterned beam of radiation on its way to the projection system PS. Preferably, the laser beams produced by the multiple lasers LAS have a grazing angle of incidence on the transparent layer TL so that most of the light in the laser beams gets reflected. The light from the laser beams LAS that is reflected at the transparent layer TL is received by an image sensor IMS located at the surface S on the other side of the slit.

Assume a set of three lasers positioned at $x=x_i$, wherein the integer $i=1$, 2 or 3. Then, the image sensor IMS receives the reflected light of the laser beams during a scan. The positions of the spots at the image sensor IMS that receive the reflected light of the laser beams are indicative of the deflection of the transparent layer TL in the z-direction at the location of reflection. From the three positions of the spots, the average deflection in the z-direction can be determined and taken as the deflection at the center of the slit center $y=y_0$.

The distance between the 3 spots on the sensor correlate with the local angle of the transparent layer TL.

This is explained with reference to the diagrams of FIG. 9 and FIG. 10.

FIG. 9 illustrates the repositioning of the laser spots at image sensor IMS upon a uniform shift of magnitude H of the transparent layer TL in the z-direction (downwards in the diagram of FIG. 9) so that the transparent layer TL remains horizontal. The scanning direction is parallel to the y-direction. When the transparent layer TL shifts downwards the spots of the three lasers LAS at the image sensor IMS shift to the right over a distance S. There is a linear relationship between the magnitude H of the downwards shift of the transparent layer TL and the distance S. Assume that adjacent ones of the three lasers have a distance Q between them. In the configuration illustrated, adjacent ones of the three spots at the image sensor IMS are at a distance Q, before and after the shift. That is, all three spots at the image sensor IMS shift over the same distance S.

Figure 10:
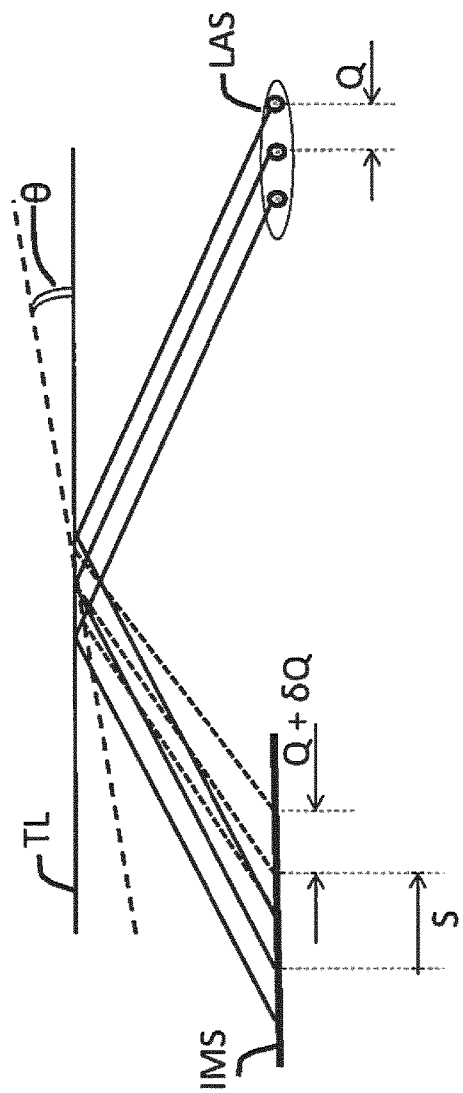

FIG. 10 illustrates the repositioning of the laser spots at image sensor IMS upon a tilting of the transparent layer TL over an angle of magnitude θ around an axis perpendicular to the y-direction and the z-direction. The tilting will result in a shift over a distance S of the three spots at the image sensor IMS. In addition, the distance between adjacent ones of the spots at the image sensor IMS will also change by an amount δQ. Using the combination of Q and δQ, the two unknowns H and θ can be determined.

Accordingly, the distance z and the local deflection ($\partial z/\partial y$) in the y-direction can be determined of the transparent layer TL at the location $y=y_0$ where the three laser beams get reflected by the transparent layer TL. In order to remove measurement noise, the distances between pairs of the three spots can be averaged. It is assumed here that ($\partial z/\partial y$) can be assumed constant in the region at the transparent layer at which the three laser beams get reflected.

If multiple sets of lasers are being used arranged in parallel in the x-direction, one can also determine the deflection ($\partial z/\partial x$) in the x-direction. FIG. 11 is a diagram of such a configuration with multiple sets of lasers, e.g., a first set LAS1 and a further set LASi, arranged in parallel in the x-direction. The slit is indicated by the abbreviation SLT in the diagram of FIG. 11.

In an embodiment, there is provided a lithographic apparatus comprising: a support constructed to support a patterning device, the patterning device being capable of imparting a radiation beam with a pattern in its cross-section to form a patterned radiation beam; a transparent layer coupled to the patterning device; a substrate table constructed to hold a substrate; a projection system configured to project the patterned radiation beam onto a target portion of the substrate; and a profiling system configured for determining a quantity representative of a deformation profile assumed by the transparent layer during a scanning movement of the lithographic apparatus.

In an embodiment, the profiling system comprises a sensor configured to sense the quantity during the scanning movement of the lithographic apparatus. In an embodiment, the sensor comprises a laser source configured to radiate a laser beam onto the transparent layer, and a detector to detect the laser beam after reflection of the laser beam at the transparent layer. In an embodiment, the profiling system is configured for determining the quantity from a movement profile of the scanning movement of the lithographic apparatus and from a mathematical model of the transparent layer. In an embodiment, the profiling system is configured for determining the quantity from a movement profile of the scanning movement of the lithographic apparatus and from a mathematical model of the transparent layer being subjected to a gas flow. In an embodiment, the profiling system comprises a memory in which data is stored that is indicative of dynamic changes in the deformation profile of the transparent layer during a scanning movement of the lithographic apparatus, the data having been determined in advance. In an embodiment, the lithographic apparatus further comprises an alignment sensor and wherein the profiling system is configured to derive the data from a measurement by the alignment sensor of an alignment profile during a scanning movement of the lithographic apparatus, and to store the data in the memory. In an embodiment, the data as stored in the memory has been derived from a projection by the lithographic apparatus of a sequence of patterns onto a substrate during a scanning movement of the lithographic apparatus, and a measurement of an error in the projected patterns as obtained during the scanning movement of the lithographic apparatus. In an embodiment, the scanning movement of the lithographic apparatus comprises an up-scan movement and a down-scan movement, the data having been derived from a comparison of a projection during the up-scan movement and a projection during the down-scan movement. In an embodiment, the profiling system is configured to calibrate the mathematical model from the data as stored in the memory. In an embodiment, the lithographic apparatus comprises a control system configured to control at least one of the projection system, the substrate table and the support under control of the quantity. In an embodiment, the control system is configured to control the at least one of the projection system, the substrate table and the support during the scanning of the substrate from the quantity determined during a scanning of a preceding substrate. In an embodiment, the control system is configured to control at least one of: a position of a projection element of the projection system, a further position of the support and another position of the substrate table.

In an embodiment, there is provided a method of operating a lithographic apparatus, wherein the method comprises: moving a patterning device, the patterning device being capable of imparting a radiation beam with a pattern in its cross-section to form a patterned radiation beam, a transparent layer being coupled to the patterning device; moving a substrate; projecting the patterned radiation beam onto a target portion of the substrate; and determining a quantity, representative of a deformation profile of the transparent layer, during a scanning movement of the lithographic apparatus.

In an embodiment, the method further comprises controlling at least one of the moving of the patterning device, the moving of the substrate and the projecting under control of the quantity.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a support constructed to support a patterning device, the patterning device being capable of imparting a radiation beam with a pattern in its cross-section to form a patterned radiation beam and having a transparent layer coupled thereto,
   a substrate table constructed to hold a substrate;
   a projection system configured to project the patterned radiation beam onto a target portion of the substrate; and
   a profiling system configured to determine a quantity representative of a deformation profile assumed by the transparent layer during a scanning movement within the lithographic apparatus,
   wherein the profiling system comprises a sensor system configured to sense the quantity during the scanning movement within the lithographic apparatus, the sensor system comprising:
      at least one laser output configured to radiate at least one laser beam at a grazing angle of incidence onto the transparent layer, and
      a detector to detect the at least one laser beam after reflection of the at least one laser beam at the transparent layer.

2. The lithographic apparatus according to claim 1, wherein the profiling system is configured to determine the quantity from a movement profile of the scanning movement within the lithographic apparatus and from a mathematical model of the transparent layer.

3. The lithographic apparatus according to claim 1, wherein the profiling system is configured to determine the quantity from a movement profile of the scanning movement within the lithographic apparatus and from a mathematical model of the transparent layer being subjected to a gas flow.

4. The lithographic apparatus according to claim 1, wherein the profiling system comprises a memory in which data is stored that is indicative of dynamic changes in the deformation profile of the transparent layer during a scanning movement within the lithographic apparatus, the data having been determined in advance.

5. The lithographic apparatus according to claim 4, further comprising an alignment sensor and wherein the profiling system is configured to derive the data from a measurement by the alignment sensor of an alignment profile during a scanning movement within the lithographic apparatus, and to store the data in the memory.

6. The lithographic apparatus according to claim 4, wherein the data as stored in the memory has been derived from a projection by the lithographic apparatus of a sequence of patterns onto a substrate during a scanning movement within the lithographic apparatus, and a measurement of an error in the projected patterns as obtained during the scanning movement within the lithographic apparatus.

7. The lithographic apparatus according to claim 4, wherein the scanning movement within the lithographic apparatus comprises an up-scan movement and a down-scan movement, the data having been derived from a comparison of a projection during the up-scan movement and a projection during the down-scan movement.

8. The lithographic apparatus according to claim 2, wherein the profiling system comprises a memory in which data is stored that is indicative of dynamic changes in the deformation profile of the transparent layer during a scanning movement within the lithographic apparatus, the data having been determined in advance and wherein the profiling system is configured to calibrate the mathematical model from the data as stored in the memory.

9. The lithographic apparatus according to claim 1, comprising a control system configured to control the projection system, the substrate table and/or the support under control of the quantity.

10. The lithographic apparatus according to claim 9, wherein the control system is configured to control the the projection system, the substrate table and/or the support during the scanning of the substrate from the quantity determined during a scanning of a preceding substrate.

11. The lithographic apparatus according to claim 9, wherein the control system is configured to control at least one selected from: a position of a projection element of the projection system, a further position of the support and/or another position of the substrate table.

12. A method of operating a lithographic apparatus, wherein the method comprises:
    moving a patterning device, the patterning device being capable of imparting a radiation beam with a pattern in its cross-section to form a patterned radiation beam, a transparent layer being coupled to the patterning device;
    moving a substrate;
    projecting the patterned radiation beam onto a target portion of the substrate;
    determining a quantity, representative of a deformation profile of the transparent layer, during a scanning movement within the lithographic apparatus, wherein the deformation profile is determined by radiating at least one laser beam at a grazing angle of incidence onto the transparent layer, and by detecting the at least one laser beam after reflection of the at least one laser beam from the transparent layer.

13. The method according to claim 12, further comprising controlling the moving of the patterning device, the moving of the substrate and/or the projecting, under control of the quantity.

14. The method according to claim 12, wherein multiple sets of laser beams arranged in parallel are radiated at a grazing angle of incidence onto the transparent layer.

15. The lithographic apparatus according to claim 1, wherein the at least one laser output comprises multiple sets of laser outputs arranged in parallel and configured to radiate multiple sets of laser beams at a grazing angle of incidence onto the transparent layer.

16. A non-transitory computer-readable medium comprising instructions configured to cause performance of:
    radiation of at least one laser beam at a grazing angle of incidence onto a transparent layer coupled to a patterning device in a lithographic apparatus, the patterning device being capable of imparting a radiation beam with a pattern in its cross-section to form a patterned radiation beam for projection onto a target portion of a movable substrate;
    detection of the at least one laser beam after reflection of the at least one laser beam from the transparent layer; and
    determination of a quantity, representative of a deformation profile of a transparent layer, during a scanning movement within the lithographic apparatus, based on the detected at least one laser beam.

17. The computer-readable medium according to claim 16, wherein the instructions are configured to cause radiation of multiple laser beams arranged in parallel at a grazing angle of incidence onto the transparent layer.

18. The computer-readable medium according to claim 16, wherein the instructions are configured to cause determination of the quantity from a movement profile of the scanning movement within the lithographic apparatus and from a mathematical model of the transparent layer.

19. The computer-readable medium according to claim 16, wherein the instructions are configured to cause determination of the quantity from a movement profile of the scanning movement within the lithographic apparatus and from a mathematical model of the transparent layer being subjected to a gas flow.

20. The computer-readable medium according to claim 16, wherein the instructions are configured to use, for determination of the quantity, data stored in a memory that is indicative of dynamic changes in the deformation profile of the transparent layer during a scanning movement within the lithographic apparatus, the data having been determined in advance.

* * * * *